United States Patent
Lin et al.

(10) Patent No.: US 8,330,358 B2
(45) Date of Patent: Dec. 11, 2012

(54) OLED ILLUMINATION DEVICE WITH IMPROVED APERTURE RATIO

(75) Inventors: Chen-Chi Lin, Hsin-Chu (TW);
Chieh-Wei Chen, Hsin-Chu (TW);
Chun-Liang Lin, Hsin-Chu (TW);
Ting-Kuo Chang, Hsin-Chu (TW)

(73) Assignee: AU Optronics Corp., Hsinchu (TW)

( * ) Notice: Subject to any disclaimer, the term of this patent is extended or adjusted under 35 U.S.C. 154(b) by 116 days.

(21) Appl. No.: 13/039,507

(22) Filed: Mar. 3, 2011

(65) Prior Publication Data

US 2012/0104936 A1 May 3, 2012

(30) Foreign Application Priority Data

Oct. 29, 2010 (TW) .............................. 99137212 A (51) Int. Cl.
*H01J 1/62* (2006.01)
*H01J 63/04* (2006.01)

(52) U.S. Cl. ........ 313/504; 313/483; 313/500; 313/501; 313/502; 313/503; 313/505; 313/506; 313/512

(58) Field of Classification Search ........................ None
See application file for complete search history.

(56) References Cited

U.S. PATENT DOCUMENTS

| | | | |
|---|---|---|---|
| 6,111,357 A * | 8/2000 | Fleming et al. ............... | 313/509 |
| 6,844,629 B2 | 1/2005 | Chen et al. | |
| 7,414,362 B2 * | 8/2008 | Chung et al. .................. | 313/506 |
| 7,696,024 B2 | 4/2010 | Maruyama et al. | |
| 8,053,260 B2 * | 11/2011 | Foust et al. ..................... | 438/28 |
| 2011/0273872 A1 * | 11/2011 | Lin et al. ........................ | 362/227 |

FOREIGN PATENT DOCUMENTS

TW 200824495 6/2008

OTHER PUBLICATIONS

Lin, Chen-Chi; Chen, Chieh-Wei; Lin, Chun-Liang; Chang, Ting-Kuo; Electronic Illuminating Device ; U.S. Appl. No. 12/939,745, filed Nov. 4, 2010.

* cited by examiner

*Primary Examiner* — Natalie Walford
(74) *Attorney, Agent, or Firm* — WPAT PC; Justin King (57) ABSTRACT

An illumination device includes a transparent substrate and multiple first metal lines. The transparent substrate includes an emitting area and a peripheral area and the emitting area includes multiple sub-emitting areas. The first metal lines are disposed on the transparent substrate, each first metal line has an end connected to a corresponding one of the sub-emitting areas and an opposite end connected to the peripheral area. Each sub-emitting area includes an insulating layer, a second metal line and an OLED layer. The second metal line is disposed between the transparent substrate and the OLED layer, the insulating layer is between the first metal lines and the second metal line, each first metal line is overlapped with the second metal line in vertical projection. One of the first metal lines, which is connected to a first one of the sub-emitting areas, passes through a second one of the sub-emitting areas.

18 Claims, 14 Drawing Sheets

OLED ILLUMINATION DEVICE WITH IMPROVED APERTURE RATIO

RELATED APPLICATIONS

This application claims priority to Taiwan Application Serial Number 099137212, filed Oct. 29, 2010, which is herein incorporated by reference.

BACKGROUND

1. Field of Invention

The present invention relates to an illumination device. More particularly, the present invention relates to an OLED (organic light emitting diode) illumination device.

2. Description of Related Art

When an OLED device serves as an illumination device or as a backlight for a liquid crystal display, the emitting area needs to be divided into multiple sub-emitting areas to satisfy the request for local dimming in a large emitting area. Each sub-emitting area has its respective signal line electrically connected to the driver circuit or driver circuit board so as to achieve the purpose of controlling respective sub-emitting areas.

Figure 12:
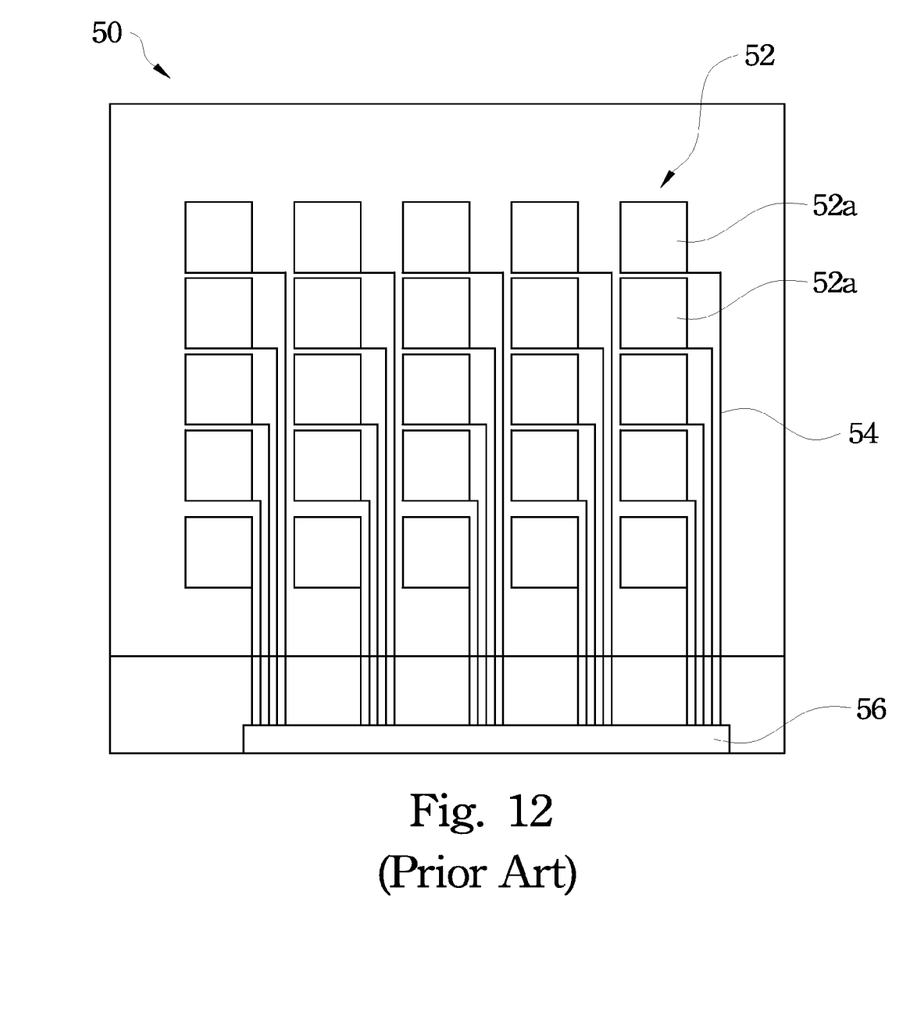
FIG. 12 illustrates a conventional OLED illumination device.

However, the metal signal line is an opaque material to reduce an emitting area or an aperture ratio of the OLED device. Referring to FIG. 12 illustrates a conventional OLED illumination device 50, an emitting area 52 of the OLED illumination device 50 is divided into multiple sub-emitting areas 52a. Each sub-emitting area 52a has its respective signal line 54 connected to a driver circuit 56 at an edge area. When the emitting area 52 is divided into more sub-emitting areas 52a, more signal lines 54 are required. Therefore, the signal lines 54 occupy more emitting areas to reduce the aperture ratio of the OLED device.

A conventional way to solve the above-discussed issue is to reduce a width of the metal signal line. However, a narrower width of the metal signal line results in higher impedance and more power consumption. Therefore, an improved design of the OLED illumination device is needed for the above-discussed issue.

SUMMARY

It is therefore an objective of the present invention to provide an illumination to device to solve the above-identified problems.

In accordance with the foregoing and other objectives of the present invention, an illumination device includes a transparent substrate and a plurality of first metal lines. The transparent substrate includes an emitting area and a peripheral area, wherein the peripheral area is disposed at an edge of the transparent substrate, and the emitting area includes a plurality of sub-emitting areas. The first metal lines are disposed on the transparent substrate, each first metal line has an end connected to a corresponding one of the sub-emitting areas and an opposite end connected to the peripheral area. Each sub-emitting area includes an insulating layer, a second metal line and an OLED layer. The second metal line is disposed between the transparent substrate and the OLED layer, the insulating layer is between the first metal lines and the second metal line, each first metal line is overlapped with the second metal line in vertical projection. One of the first metal lines, which is connected to a first one of the sub-emitting areas, passes through a second one of the sub-emitting areas.

According to an embodiment disclosed herein, the illumination device includes a driver circuit disposed on the peripheral area.

According to another embodiment disclosed herein, the illumination device includes a driver circuit, which is electrically connected to the opposite end of each first metal line within the peripheral area.

According to another embodiment disclosed herein, a number of the first metal lines connected between the peripheral area and a farther one of the sub-emitting areas is greater than a number of the first metal lines connected between the peripheral area and a closer one of the sub-emitting areas.

According to another embodiment disclosed herein, the first metal lines and second metal line are opaque metal lines.

According to another embodiment disclosed herein, the first metal line and second metal line share an equal width.

According to another embodiment disclosed herein, the first metal line and second metal line are different in respective widths by less than 20%.

According to another embodiment disclosed herein, the first metal lines are in parallel with one another.

According to another embodiment disclosed herein, the second metal lines in respective sub-emitting areas are different in respective widths by less than 20%.

According to another embodiment disclosed herein, the insulating layer has a through hole, through which the second metal line is connected to a corresponding one of the first metal lines.

According to another embodiment disclosed herein, the illumination device includes a transparent anode layer, which is disposed above the second metal line and disposed between the OLED layer and the second metal line.

According to another embodiment disclosed herein, the insulating layer has a through hole, through which the first metal line is connected to the transparent anode layer.

According to another embodiment disclosed herein, the second metal line within the first one of the sub-emitting areas is insulated from the second metal line within a second one of the sub-emitting areas.

According to another embodiment disclosed herein, the sub-emitting areas generally have the same shape and area.

According to another embodiment disclosed herein, the second metal line is to formed as grids or meshes within each sub-emitting area.

According to another embodiment disclosed herein, the illumination device includes an opaque cathode layer disposed above the OLED layer.

According to another embodiment disclosed herein, one of the first metal lines, which is connected to the first one of the sub-emitting areas, is overlapped with the second metal line, within the second one of the sub-emitting areas, in vertical projection.

Thus, the OLED illumination device utilizes its design of "the first metal line overlapped with the second metal line" to effectively increase its emitting area or aperture ratio (compared with a conventional OLED illumination device). Besides, the design "a number of the first metal lines connected between the peripheral area (or a driver circuit) and a farther one of the sub-emitting areas is greater than a number of the first metal lines connected between the peripheral area (or a driver circuit) and a closer one of the sub-emitting areas" balances electrical currents or signals to each sub-emitting area, thereby achieving the uniform illumination for multiple sub-emitting areas.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
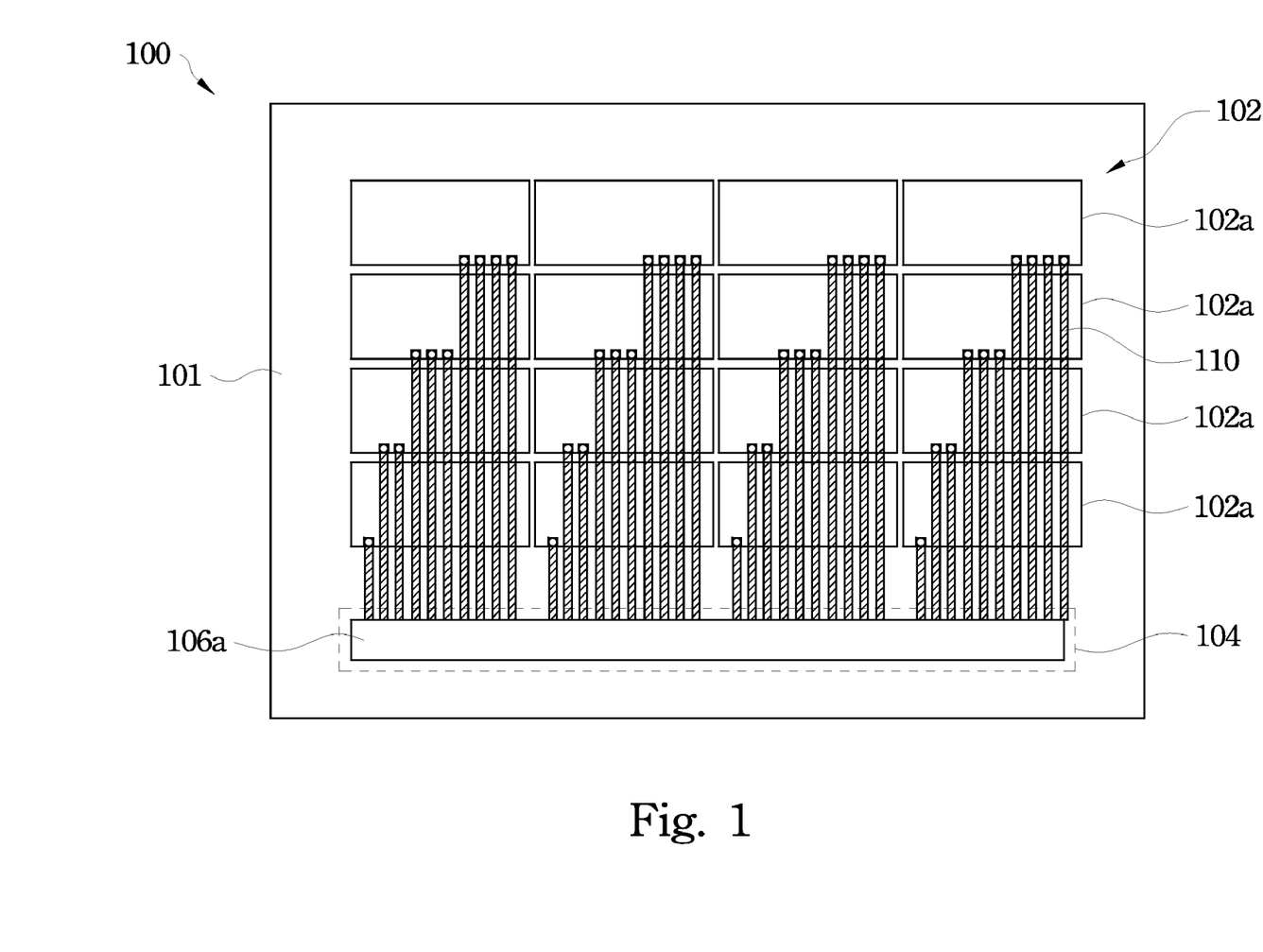
FIG. 1 illustrates a planar view of an OLED illumination device according to an embodiment of this invention.

Referring to FIG. 1, illustrates a planar view of an OLED illumination device according to an embodiment of this invention. An OLED illumination device 100 has an emitting area 102, which are divided into a plurality of sub-emitting areas 102a. In this embodiment, each sub-emitting area 102a has substantially or exactly the same shape and area. Each sub-emitting area 102a has its first metal line 110 (also referred as a signal line herein) connected to a driver circuit 106a, which sends driver signals to each sub-emitting area 102a via the first metal line 110 to achieve the purpose of controlling respective sub-emitting areas. That is, the first metal line 110 has an end connected to respective sub-emitting area 102a (referring also to an interconnection section 103 in FIGS. 1A and 1B) and an opposite end connected to a peripheral area 104.

In this embodiment, the driver circuit 106a is located on the peripheral area 104 of the transparent substrate 101 (referring to FIG. 1). In an alternate embodiment (referring to FIGS. 1A and 1B), the driver circuit 106b is not located on the transparent substrate (e.g. the transparent substrate 101 as illustrated in FIG. 1), but located on a separate printed circuit board. In the later embodiment, all the first metal lines 110 are connected to the driver circuit 106b via the peripheral area 104. In other words, the driver circuit 106a (106b) may be disposed on the peripheral area 104 of the transparent substrate 101 and may be on a printed circuit board separated from or connected with the transparent substrate 101.

Figure 1A:
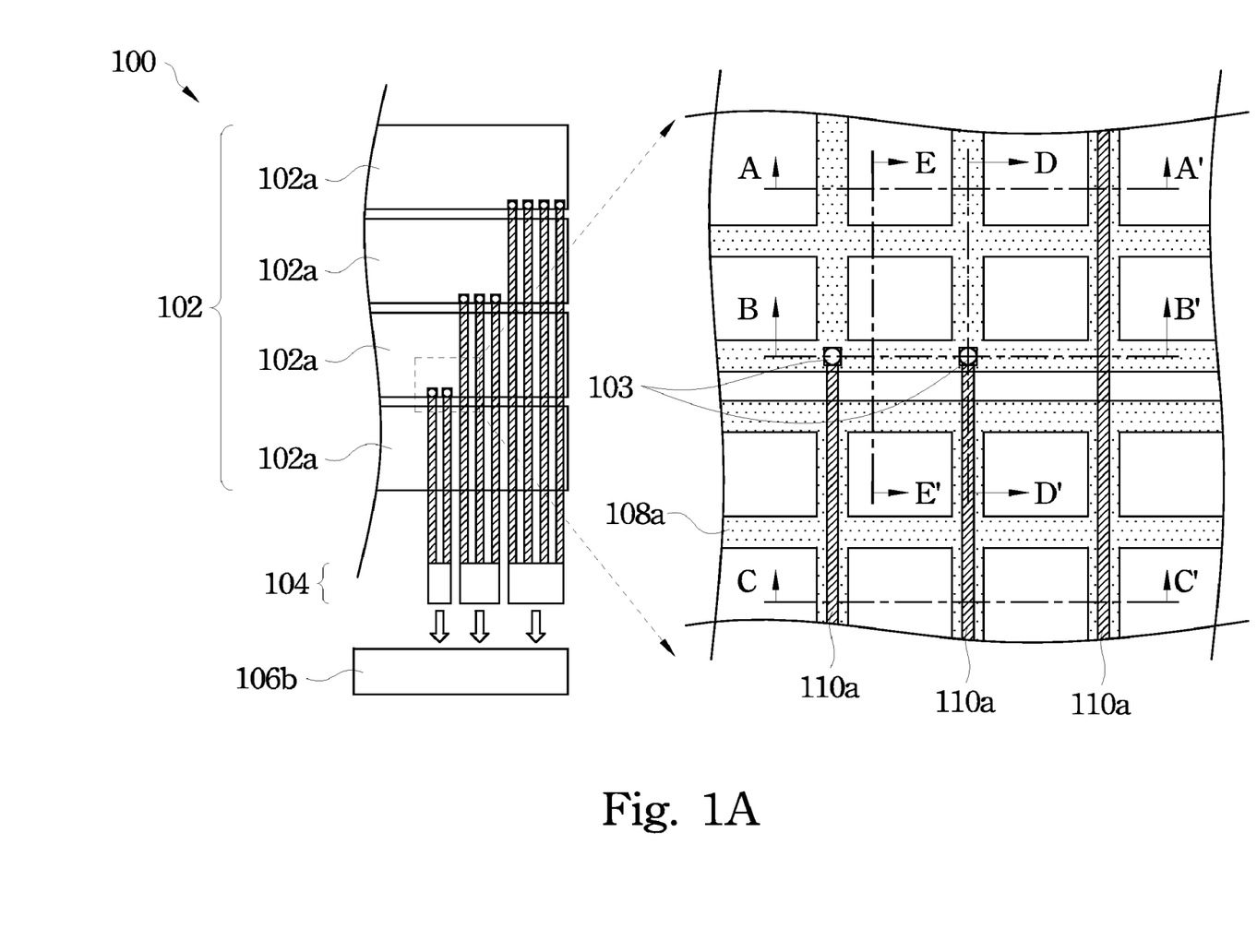
FIG. 1A illustrates a portion of the OLED illumination device and an enlarged view thereof according to an embodiment of this invention.
Figure 1B:
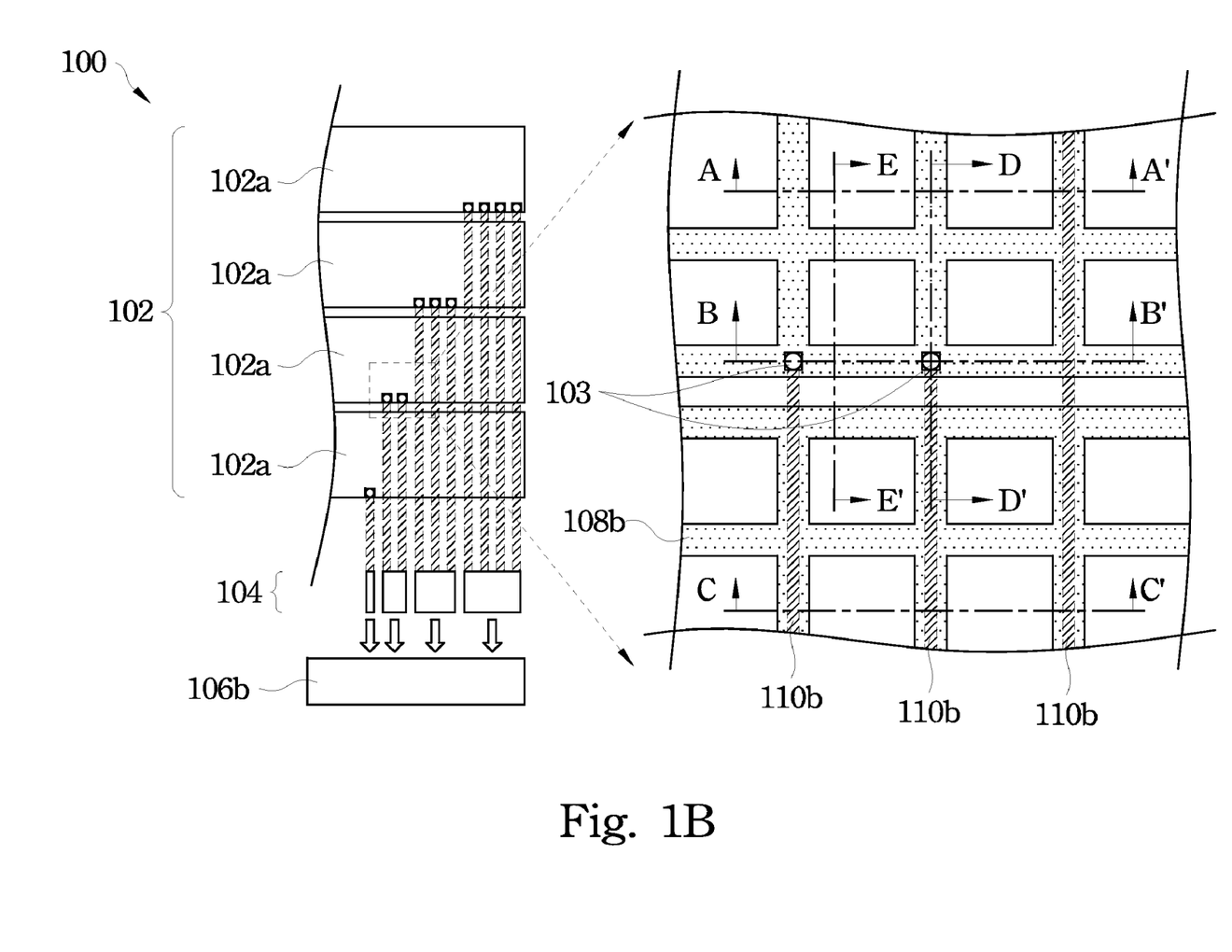
FIG. 1B illustrates a portion of the OLED illumination device and an enlarged view thereof according to another embodiment of this invention.

Referring to FIGS. 1A and 1B, wherein FIG. 1A illustrates a portion of the OLED illumination device and an enlarged view thereof according to an embodiment of this invention, and FIG. 1B illustrates a portion of the OLED illumination device and an enlarged view thereof according to another embodiment of this invention. It is noted that FIGS. 1A and 1B illustrate the view, which is viewed from the side of the transparent substrate 101 (referring to FIGS. 2-11).

In the embodiment of FIG. 1A, the first metal line 110a is overlapped with the second metal line 108a within the same sub-emitting area 102a (referring also to FIG. 2), and is overlapped with the second metal line 108a within another sub-emitting area 102a, so as to increase an aperture ratio or emitting areas of the OLED illumination device 100. In the embodiment of FIG. 1A, the first metal line 110a is disposed under the second metal line 108a to overlap with the second metal line 108a along the vertical projection direction in the same sub-emitting area 102a. Furthermore, the first metal line 110a in the sub-emitting area 102a passes through another sub-emitting area 102a to be overlapped with the second metal line 108a of another sub-emitting area 102a in the vertical projection. In other words, the first metal line 110a in the sub-emitting area 102a is overlapped with the second metal line 108a within another sub-emitting area 102a near by the sub-emitting area 102a. For examples in the FIG. 1A illustrated four sub-emitting area 102a, the first metal line 110a in the top sub-emitting area 102a passes through the lower sub-emitting area 102a (closer to the peripheral area 104 or driver circuit 106b) to be overlapped with the second metal line 108a of the lower sub-emitting area 102a in the vertical projection.

In the embodiment of FIG. 1B, the first metal line 110b is overlapped with the second metal line 108b within the same sub-emitting area 102a (referring also to FIG. 3), and is overlapped with the second metal line 108b within another lower sub-emitting area 102a, so as to increase an aperture ratio or emitting areas of the OLED illumination device 100. As mentioned in the embodiment of FIG. 1B, the first metal line 110a is disposed above the second metal line 108a to overlap with the second metal line 108a in the vertical projection in the same sub-emitting area 102a.

In order to increase an aperture ratio or emitting areas of each sub-emitting area 102a, the second metal lines (108a, 108b) are overlapped with the first metal lines (110a, 110b). By "overlapped" disclosed herein, the second metal lines (108a, 108b) are not necessarily in contact with the first metal lines (110a, 110b), i.e. an intervening layer may be located between the first and second lines. Therefore, by the term "overlapped" disclosed herein, it means "being overlapped in vertical projection".

As illustrated in enlarged views of FIGS. 1A and 1B, the second metal lines (108a, 108b) are formed as grids or meshes within each sub-emitting area 102a to uniform the impedance and currents within each sub-emitting area 102a, and it results in uniform illumination within each sub-emitting area 102a. Because the second metal lines (108a, 108b) are opaque materials, "the first metal lines (110a, 110b) overlapped with the second metal lines (108a, 108b)" would not occupy more emitting areas or areas on the transparent substrate, e.g. substrate 101 as illustrated in FIG. 1 such that the aperture ratio or emitting areas of the OLED illumination device 100 can be increased. As illustrated in the embodiments of FIGS. 1A and 1B, the first metal lines (110a, 110b) are not only overlapped with the second metal lines (108a, 108b) within the same sub-emitting area 102a, but also overlapped with the second metal lines (108a, 108b) within another lower (closer to the peripheral area 104 or driver circuit 106b) sub-emitting area 102a, so as to increase an aperture ratio or emitting areas of the OLED illumination device 100. The embodiment as above mention only describes the relationship of the first metal line (110a, 110b) and the second metal line (108a, 108b) between the adjacent sub-emitting area 102a, but the invention is not limited to.

In this embodiment, the first metal lines (110a, 110b) are preferably equal in respective widths, but not limited to. The first metal lines (110a, 110b) may be different in respective widths owing to manufacturing tolerances or other factors. In this embodiment, the first metal lines (110a, 110b) may be different in respective widths by less than 20%.

Because a distance between each sub-emitting area 102a and the driver circuit (106a, 106b) or peripheral area 104 is different, the first metal lines (110a, 110b) connected between the peripheral area 104 and a farther one of the sub-emitting areas 102a are different in impedance with the first metal lines (110a, 110b) connected between the peripheral area 104 and a closer one of the sub-emitting areas 102a if each first metal line (110a, 110b) has an equal width and cross-section. Therefore, each sub-emitting area 102a would receive unbalanced electrical currents or signals from the peripheral area 104 or the driver circuit (106a, 106b), thereby influencing the emitting control. In other words, the brightness of the sub-emitting area 102a is affected by the electrical current from the driver circuit (106a, 106b). Thus, each sub-emitting area 102a is controlled by the different electrical current may cause the different brightness of each sub-emitting area 102a. In this embodiment, in order to permit each sub-emitting area 102a to receive balanced electrical currents or signals from the peripheral area 104 or the driver circuit (106a, 106b), a number of the first metal lines (110a, 110b) connected between the peripheral area 104 and a farther one of the sub-emitting areas 102a is greater than a number of the first metal lines connected between the peripheral area 104 and a closer one of the sub-emitting areas 102a. That is, the first metal lines (110a, 110b) connected between the peripheral area 104 and a farther one of the sub-emitting areas 102a are generally equal in impedance with the first metal lines (110a, 110b) connected between the peripheral area 104 and a closer one of the sub-emitting areas 102a. It especially mentions each first metal line (110a, 110b) has an equal width and cross-section in this embodiment of the invention.

Take FIG. 1 as an example, the sub-emitting area 102a, which is closer to the peripheral area 104, has single one first metal line 110 while the sub-emitting area 102a, which is farther from the peripheral area 104, has four parallel metal lines 110, thereby balancing the impedances between each sub-emitting area 102a and the peripheral area 104.

Because of the design "the first metal lines (110a, 110b) overlapped with the second metal lines (108a, 108b)" (Referring to enlarged views of FIGS. 1A and 1B), increasing first metal lines (110a, 110b) does not necessarily reduce the aperture ratio or emitting areas of the OLED illumination device. That is, the first metal lines (110a, 110b) are entirely or largely overlapped with the second metal lines (108a, 108b), thereby hardly impacting the aperture ratio or emitting areas of the OLED illumination device. The first metal lines (110a, 110b) are not necessarily formed on additional areas on the transparent substrate so as to increase more areas as emitting areas, e.g. increase the number of the sub-emitting areas 102a or the area of each sub-emitting area 102a.

In the embodiments of FIGS. 1A and 1B, multiple first metal lines (110a, 110b) are in parallel with one another and intervals between any adjacent first metal lines (110a, 110b) are equal. The first metal lines (110a, 110b) may be different in respective widths owing to manufacturing tolerances or other factors. In this embodiment, the first metal lines (110a, 110b) may be different in respective widths by less than 20%.

The following cross-sectional views are used to describe the detailed structure of the OLED illumination device.

Figure 2:
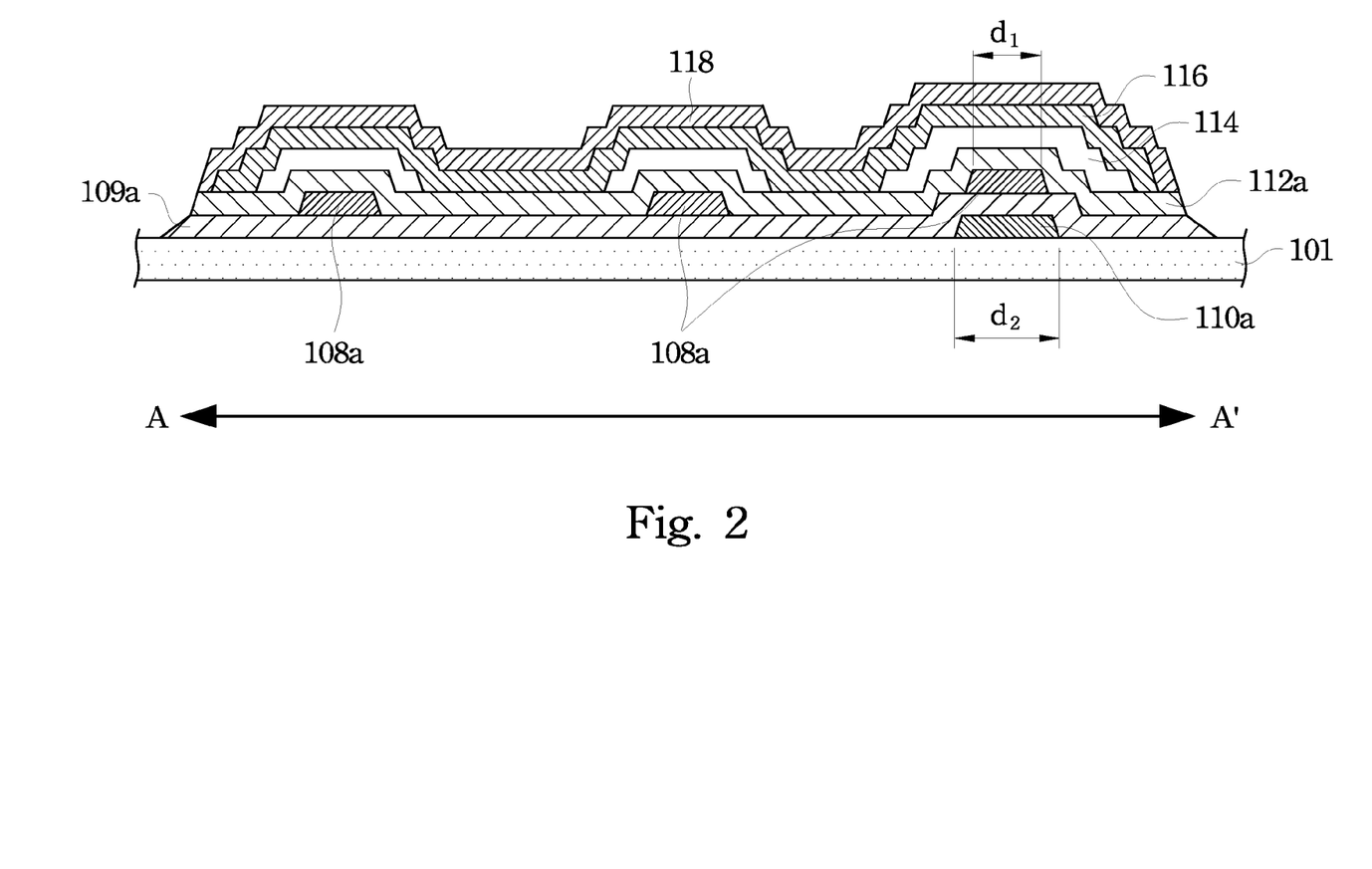
FIG. 2 illustrates a cross-sectional view taken along the cross-sectional line A-A' in FIG. 1A.

Referring to FIG. 2, which illustrates a cross-sectional view taken along the cross-sectional line A-A' in FIG. 1A. The OLED illumination device includes a first metal line 110a, an insulating layer 109a, a second metal line 108a, a transparent anode layer 112a, an insulating layer 114, an OLED layer 116 and an opaque cathode layer 118 on a transparent substrate 101 (e.g. a glass substrate) from bottom to top. As illustrated in this view, the second metal line 108a is located between the transparent substrate 101 and the OLED layer 116, the insulating layer 109a is located between the second metal line 108a and the first metal line 110a, the transparent anode layer 112a (e.g. indium tin oxide, ITO) is located above the second metal line 108a and located between the OLED layer 116 and the second metal line 108a, and the opaque cathode layer 118 is located above the OLED layer 116, wherein the insulating layer 114 is located under the OLED layer 116. In this embodiment, the right second metal line 108a is overlapped with and above the first metal line 110a. By the term "overlapped" herein, it also means "entirely overlapped" or "partially overlapped". In this embodiment, the second metal line 108a has a width ($d_1$) smaller than a width ($d_2$) of the first metal line 110a. The width ($d_1$) can be equal to or larger than width ($d_2$), but preferably different in respective widths by less than 20%, i.e. a width difference $[(d1-d2)/d1]<20\%$ (when $d_1$ is a greater value) or a width difference $[(d2-d1)/d2]<20\%$ (when $d_2$ is a greater value).

Figure 3:
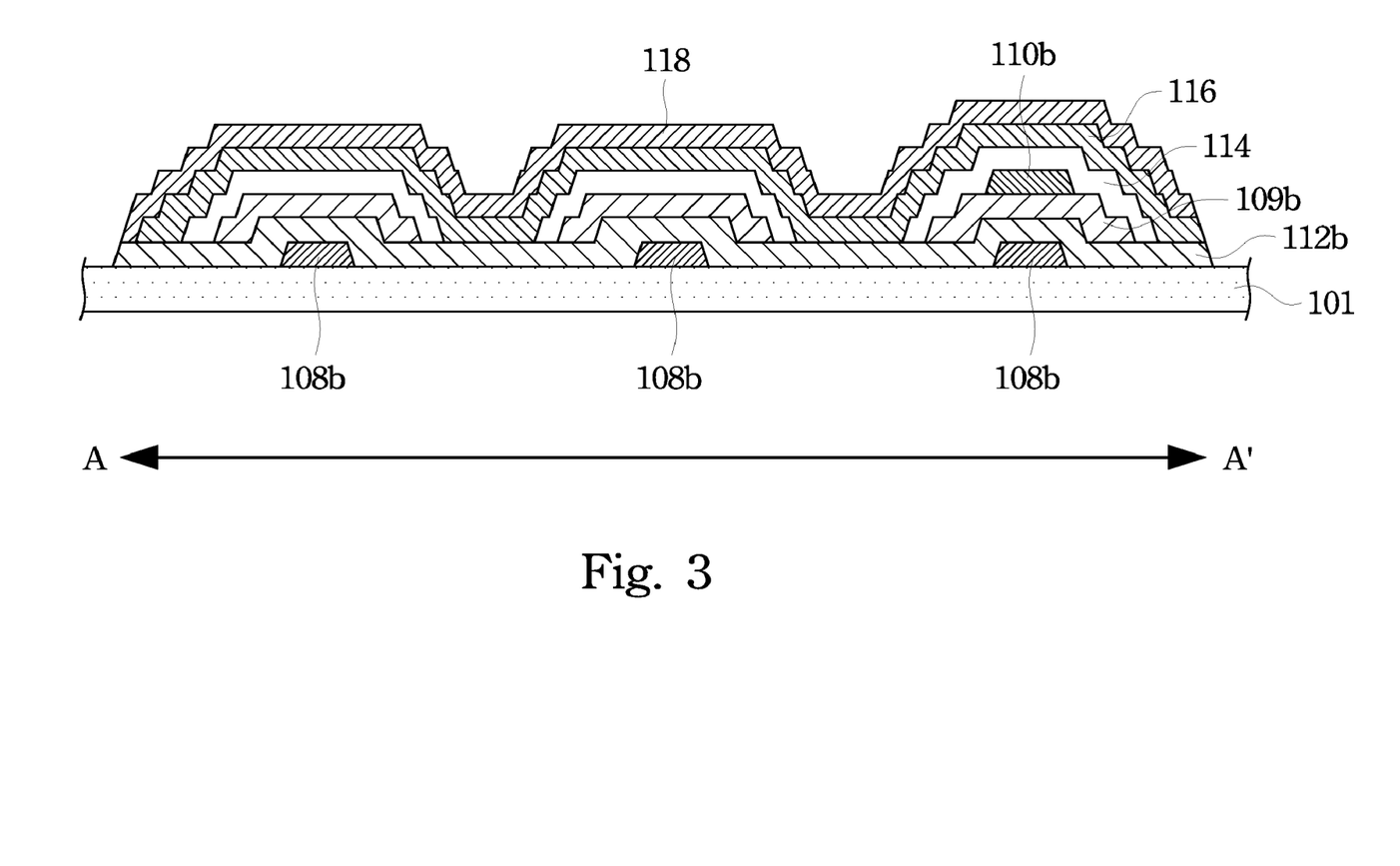
FIG. 3 illustrates a cross-sectional view taken along the cross-sectional line A-A' in FIG. 1B.

Referring to FIG. 3, which illustrates a cross-sectional view taken along the cross-sectional line A-A' in FIG. 1B. The OLED illumination device includes a second metal line 108b, a transparent anode layer 112b, an insulating layer 109b, a first metal line 110b, an insulating layer 114, an OLED layer 116 and an opaque cathode layer 118 on a transparent substrate 101 (e.g. a glass substrate) from bottom to top. The difference between FIG. 3 and FIG. 2 lies in that the first metal line and the second metal line are reversed in position. As illustrated in this view, the insulating layer 109b is located between the second metal line 108b and the first metal line 110b, the transparent anode layer 112b (e.g. indium tin oxide, ITO) is located above the second metal line 108b and located between the OLED layer 116 and the second metal line 108a, and the opaque cathode layer 118 is located above OLED layer 116, wherein the insulating layer 114 is located under OLED layer 116. As illustrated in this view, within the area where the right first metal line 110b is overlapped with the second metal line 108b, the first metal line 110b is sandwiched between two insulating layers (109b, 114), and the insulating layer 114 is located between the OLED layer 116 and the first metal line 110b. Within the area where the left first metal line 110b is overlapped with the second metal line 108b, two insulating layers are (109b, 114) are overlapped.

In this embodiment, the first metal line 110b is overlapped with and above the second metal line 108b. By the term "overlapped" herein, it also means "entirely overlapped" or "partially overlapped". In this embodiment, the second metal line 108b has a width smaller than a width of the first metal line 110b. The width of the second metal line 108b can be equal to or larger than the width of the first metal line 110b, but preferably different in respective widths by less than 20% (referring to the embodiment of FIG. 2 for the exact definition).

Figure 4:
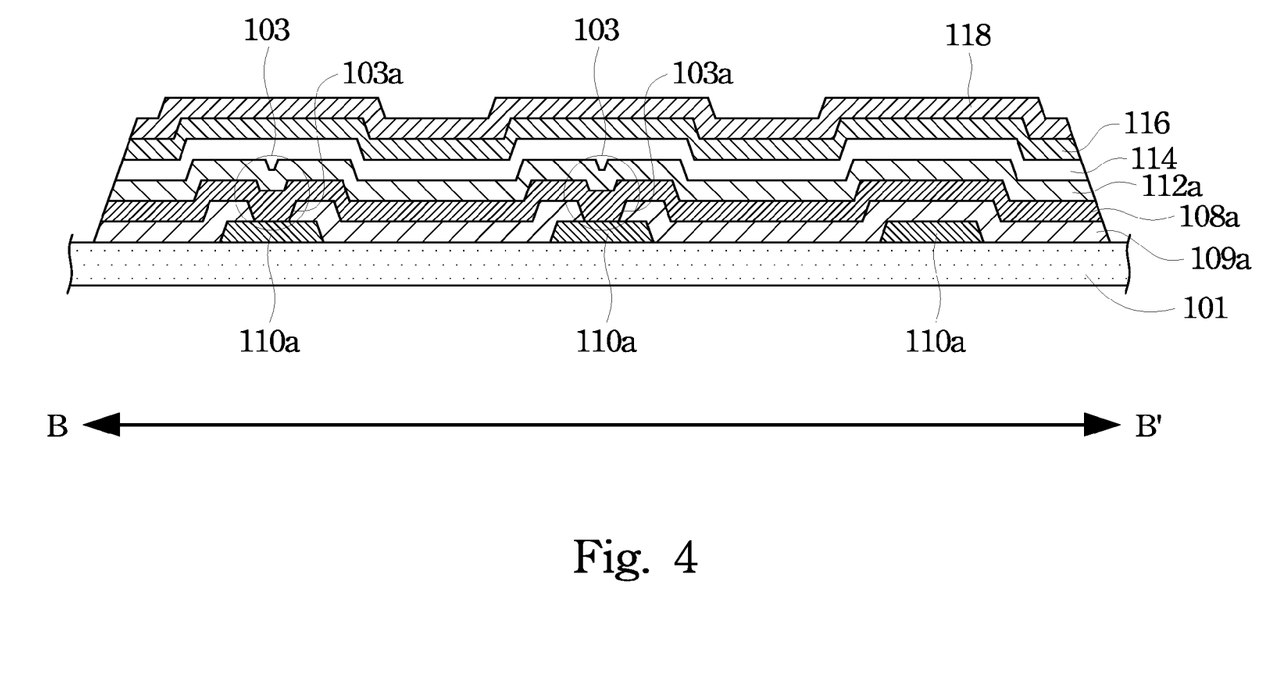
FIG. 4 illustrates a cross-sectional view taken along the cross-sectional line B-B' in FIG. 1A.
Figure 5:
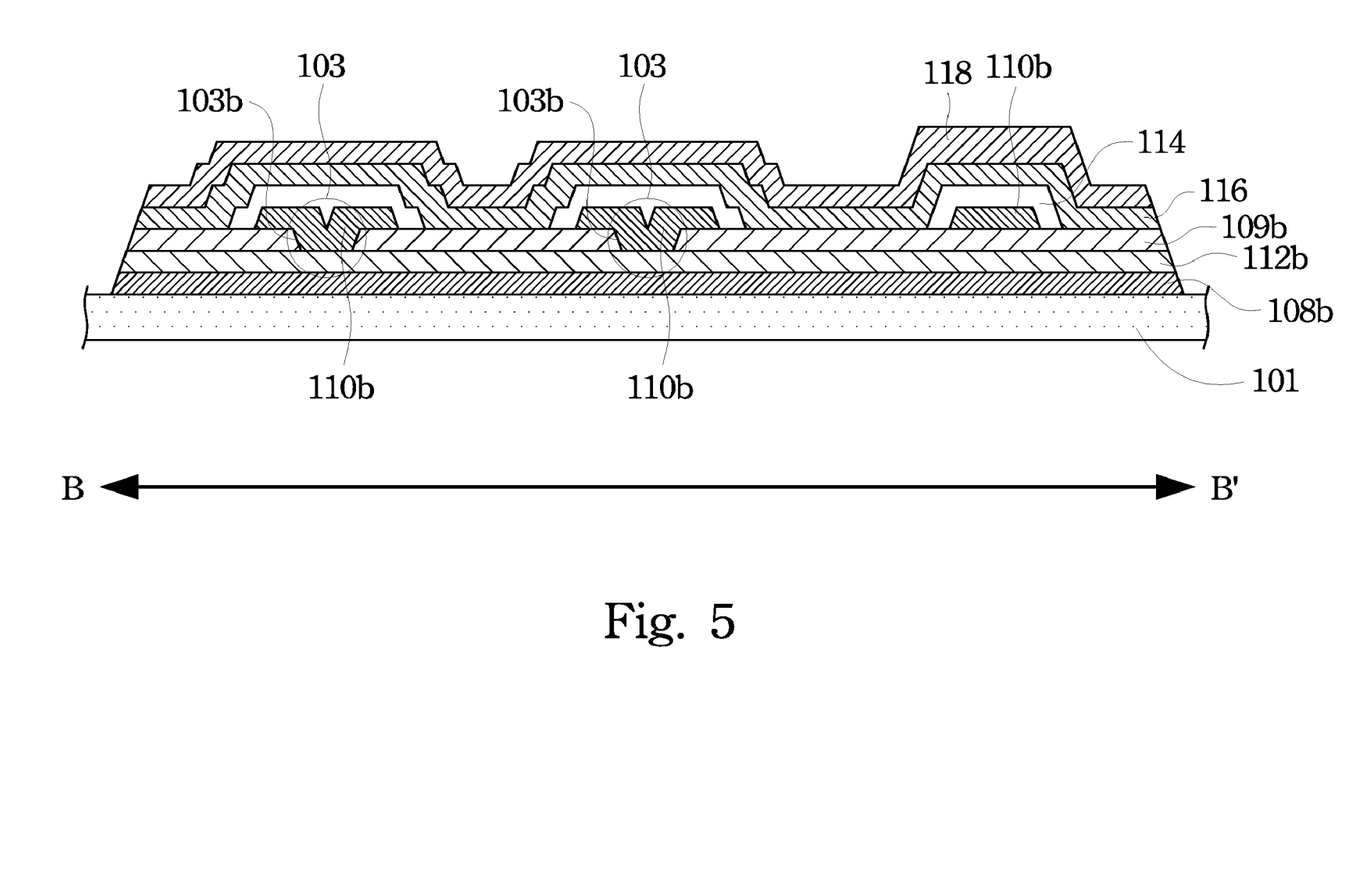
FIG. 5 illustrates a cross-sectional view taken along the cross-sectional line B-B' in FIG. 1B.

Referring to both FIGS. 4 and 5, wherein FIG. 4 illustrates a cross-sectional view taken along the cross-sectional line B-B' in FIG. 1A while FIG. 5 illustrates a cross-sectional view taken along the cross-sectional line B-B' in FIG. 1B. Two cross-sectional views show the relationship between the first metal line and the second metal line, e.g. an interconnection section 103 in FIGS. 4 and 5.

Referring to FIG. 4, the sub-emitting area 102a has an interconnection section 103 and a through hole 103a, wherein the interconnection section 103 establishes an electrical interconnection between the first metal line 110a and the second metal line 108a, and the through hole 103a is formed on the insulating layer 109a. Within the interconnection section 103, the through hole 103a allows the second metal line 108a go through the insulating layer 109a to connect with the first metal line 110a so as to establish an electrical interconnection between the first metal line 110a and the second metal line 108a.

Referring to FIG. 5, within each interconnection section 103 between the second metal line 108b and the first metal line 110b, the insulating layer 109b has a through hole 103b, which allows the first metal line 110b go through the insulating layer 109b and connect to the transparent anode layer 112b. Thus, the first metal line 110b is electrically connected to the second metal line 108b via the transparent anode layer 112b. Because the transparent anode layer 112b has a relatively large sheet resistance (compared with the second metal line 108b or the metal materials), when an electrical current, transferred from first metal line 110b, arrives the transparent anode layer 112b, it cannot distribute evenly over the transparent anode layer 112b due to the higher sheet resistance. At the same time, the transparent anode layer 112b needs to be relatively thin so as to be "transparent". It results that the resistance in the vertical direction (from the first metal line 110b to the second metal line 108b) is smaller than the resistance in the horizontal direction in the transparent anode layer 112b. Therefore, the electrical current, transferred from first metal line 110b, tends to go the second metal line 108b and distribute evenly over the second metal line 108b, thereby achieving the uniform illumination. In this embodiment, the second metal line 108b is formed as grids or meshes within each sub-emitting area so as to reduce a bulk impedance of each sub-emitting area. The difference between the embodiment of FIG. 5 and the embodiment of FIG. 4 lies in that the first metal line 110b goes through the through hole 103b of the insulating layer 109b and is connected to the transparent anode layer 112b, rather than directly connected to the second metal line 108b, besides the reversed positions between the first metal line and second metal line.

Figure 6:
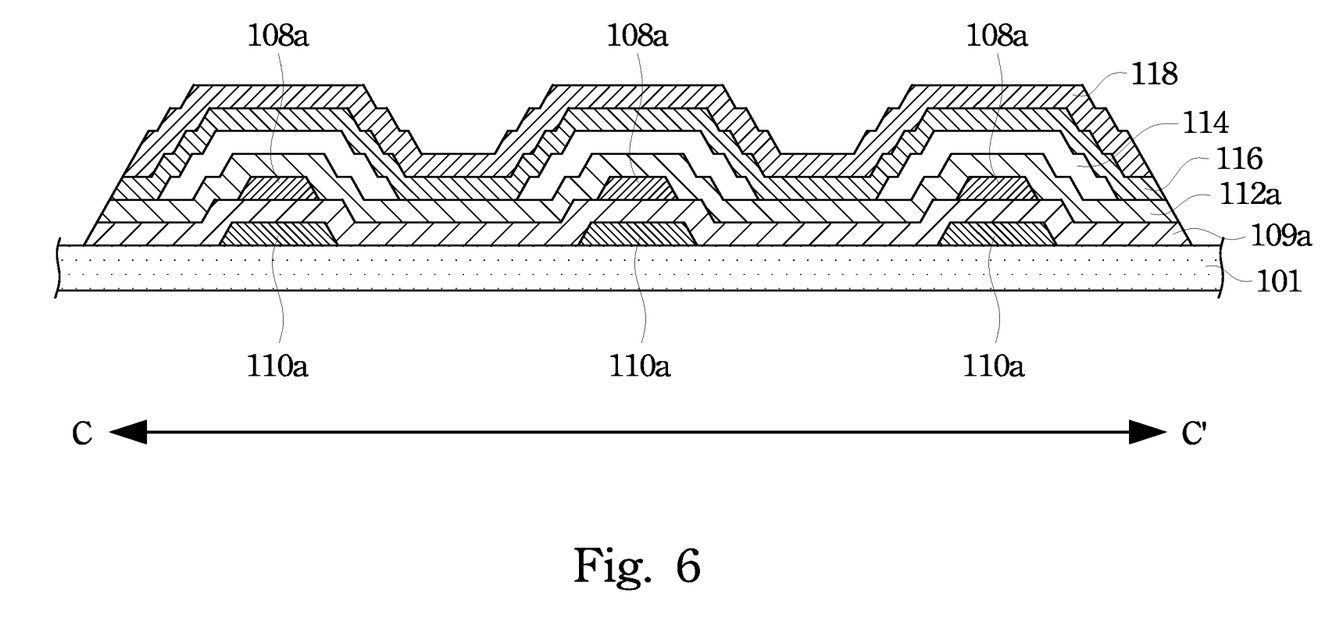
FIG. 6 illustrates a cross-sectional view taken along the cross-sectional line C-C' in FIG. 1A.
Figure 7:
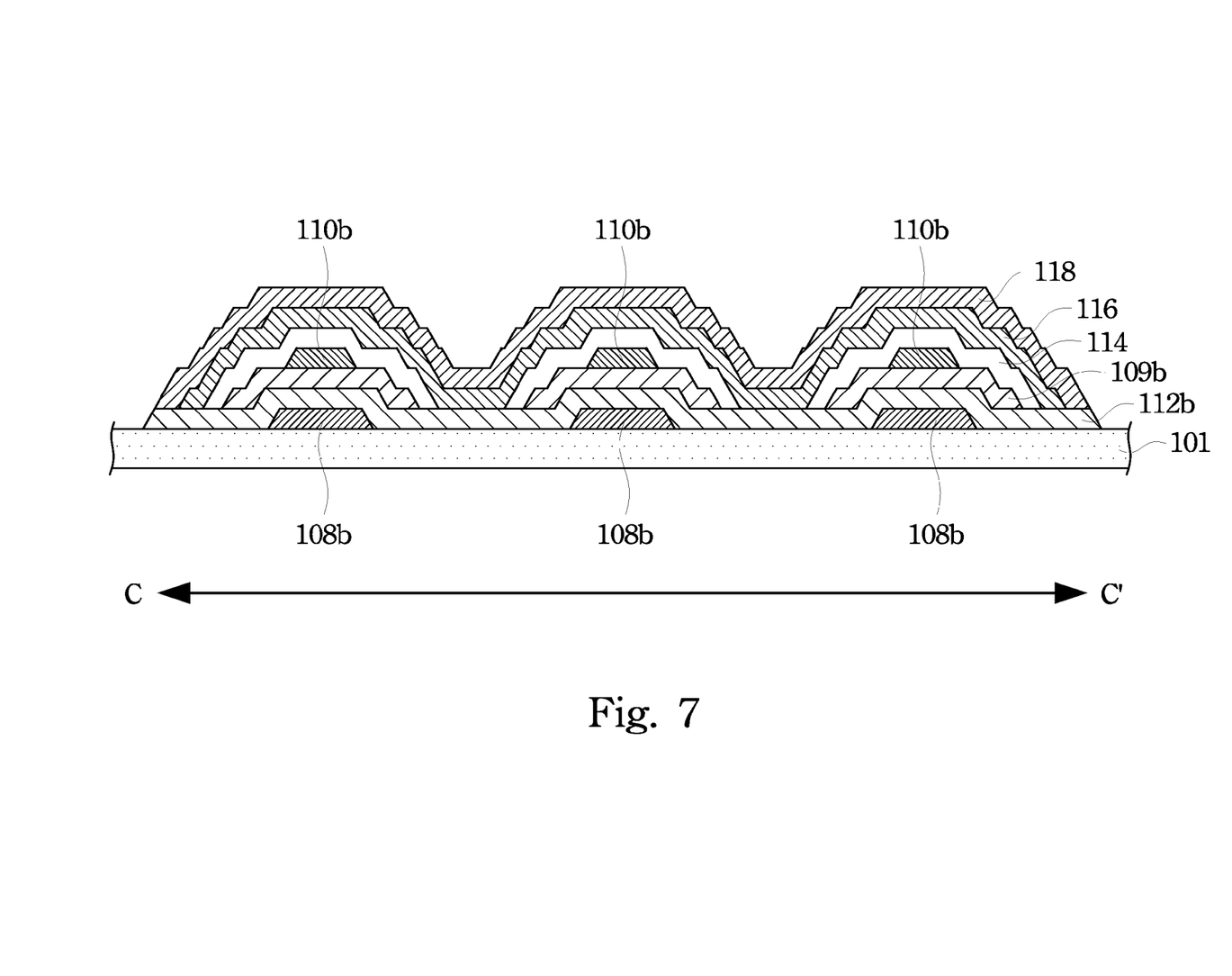
FIG. 7 illustrates a cross-sectional view taken along the cross-sectional line C-C' in FIG. 1B.

Referring to both FIGS. 6 and 7, wherein FIG. 6 illustrates a cross-sectional view taken along the cross-sectional line C-C' in FIG. 1A while FIG. 7 illustrates a cross-sectional view taken along the cross-sectional line C-C' in FIG. 1B.

Referring to both FIGS. 2 and 6, the major difference between FIGS. 2 and 6 lies in that FIG. 6 illustrates three first metal lines 110a overlapped with second metal lines 108a while FIG. 2 illustrates only one first metal line 110a overlapped with the second metal line 108a. In this embodiment, the second metal line 108a has a width smaller than a width of the first metal line 110a. The width of the second metal line 108a can be equal to or larger than the width of the first metal line 110a, but preferably different in respective widths by less than 20%.

Referring to both FIGS. 3 and 7, the major difference between FIGS. 3 and 7 lies in that FIG. 7 illustrates 3 first metal lines 110b overlapped with second metal lines 108b while FIG. 3 illustrates only one first metal line 110b overlapped with the second metal line 108b. In this embodiment, the second metal line 108b has a width larger than a width of the first metal line 110b. The width of the second metal line 108b can be equal to or smaller than the width of the first metal line 110b, but preferably different in respective widths by less than 20%.

Figure 8:
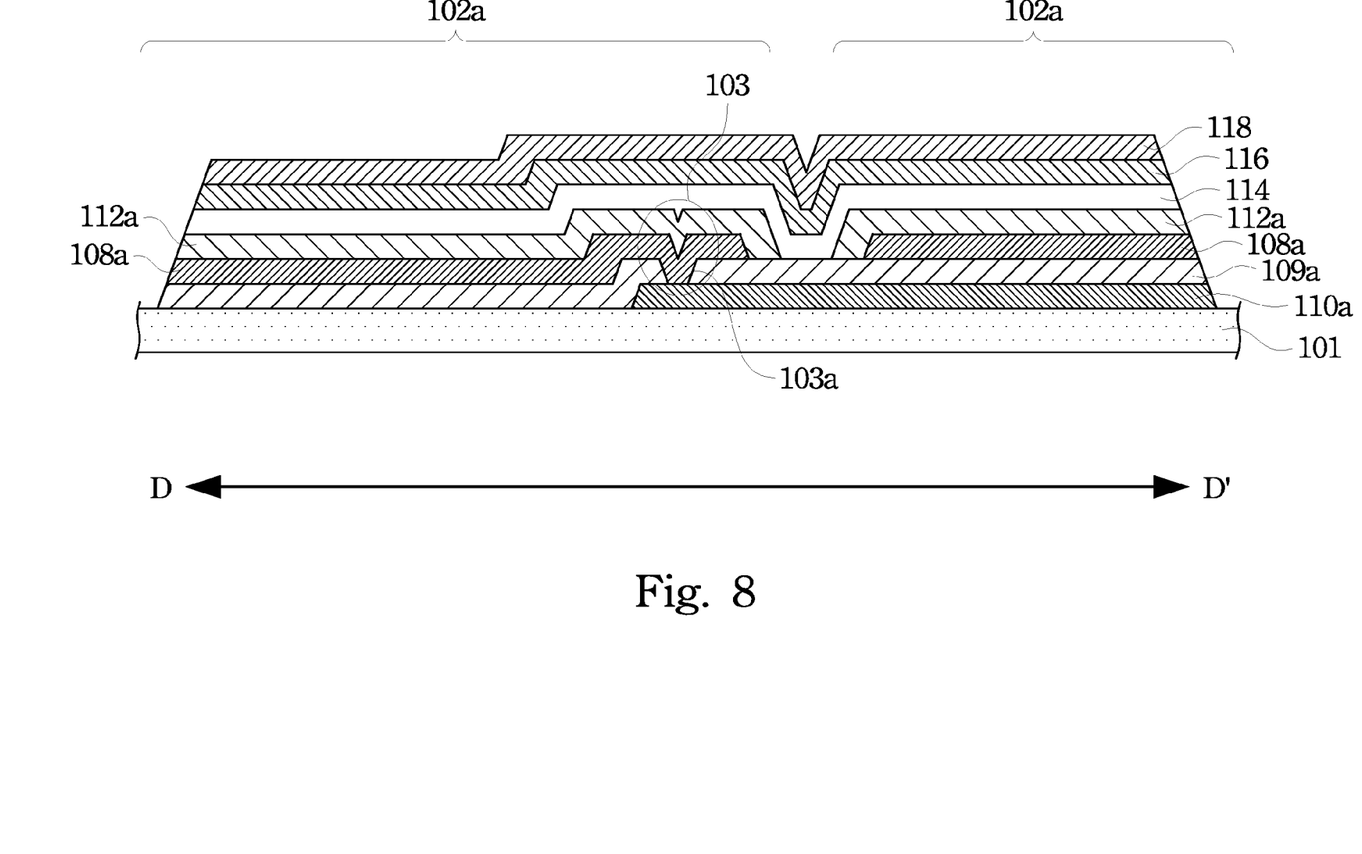
FIG. 8 illustrates a cross-sectional view taken along the cross-sectional line D-D' in FIG. 1A.
Figure 9:
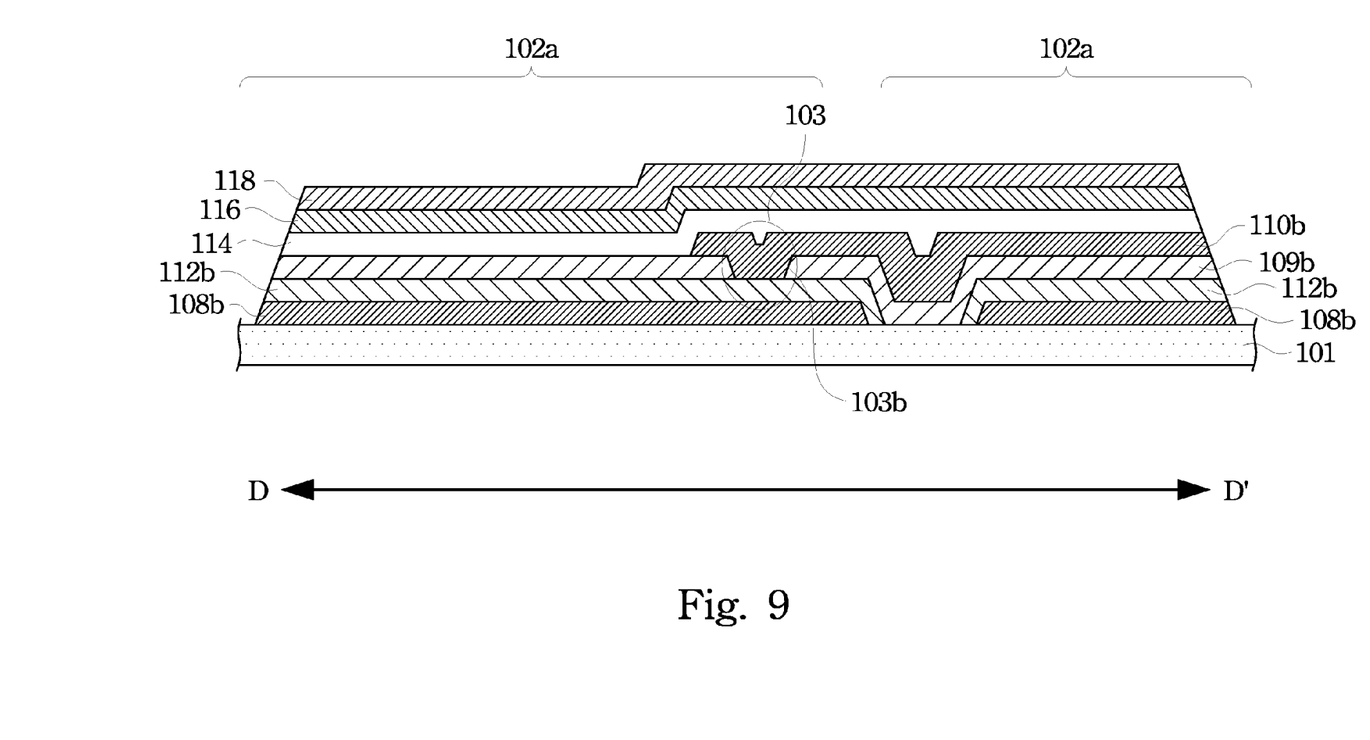
FIG. 9 illustrates a cross-sectional view taken along the cross-sectional line D-D' in FIG. 1B.

Referring to both FIGS. 8 and 9, wherein FIG. 8 illustrates a cross-sectional view taken along the cross-sectional line D-D' in FIG. 1A while FIG. 9 illustrates a cross-sectional view taken along the cross-sectional line D-D' in FIG. 1B. These two cross-sectional views cross two adjacent sub-emitting areas 102a.

Within the interconnection section 103 of FIG. 8, the left second metal line 108a goes through the through hole 103a of the insulating layer 109a and then connects to the first metal line 110a. In this embodiment, the first metal line 110a, which transfers control signals to the left sub-emitting area 102a, is not only overlapped with the second metal line 108a within the left sub-emitting area 102a, but also passes through another (right) sub-emitting area 102a and is overlapped with the second metal line 108a within another (right) sub-emitting area 102a. However, the second metal line 108a and the transparent anode layer 112a are disconnected and insulated by a border between the left and right sub-emitting areas 102a.

Within the interconnection section 103 of FIG. 9, the first metal line 110b goes through the through hole 103b of the insulating layer 109b and connects to the transparent anode layer 112b. In the embodiment of FIG. 9, the first metal line 110b, which transfers control signals to the left sub-emitting area 102a, is not only overlapped with the second metal line 108b within the left sub-emitting area 102a, but also passes through the right sub-emitting area 102a to be overlapped with the second metal line 108b within the right sub-emitting area 102a. However, the second metal line 108b and the transparent anode layer 112b are disconnected and insulated by a border between the left and right sub-emitting areas 102a.

Figure 10:
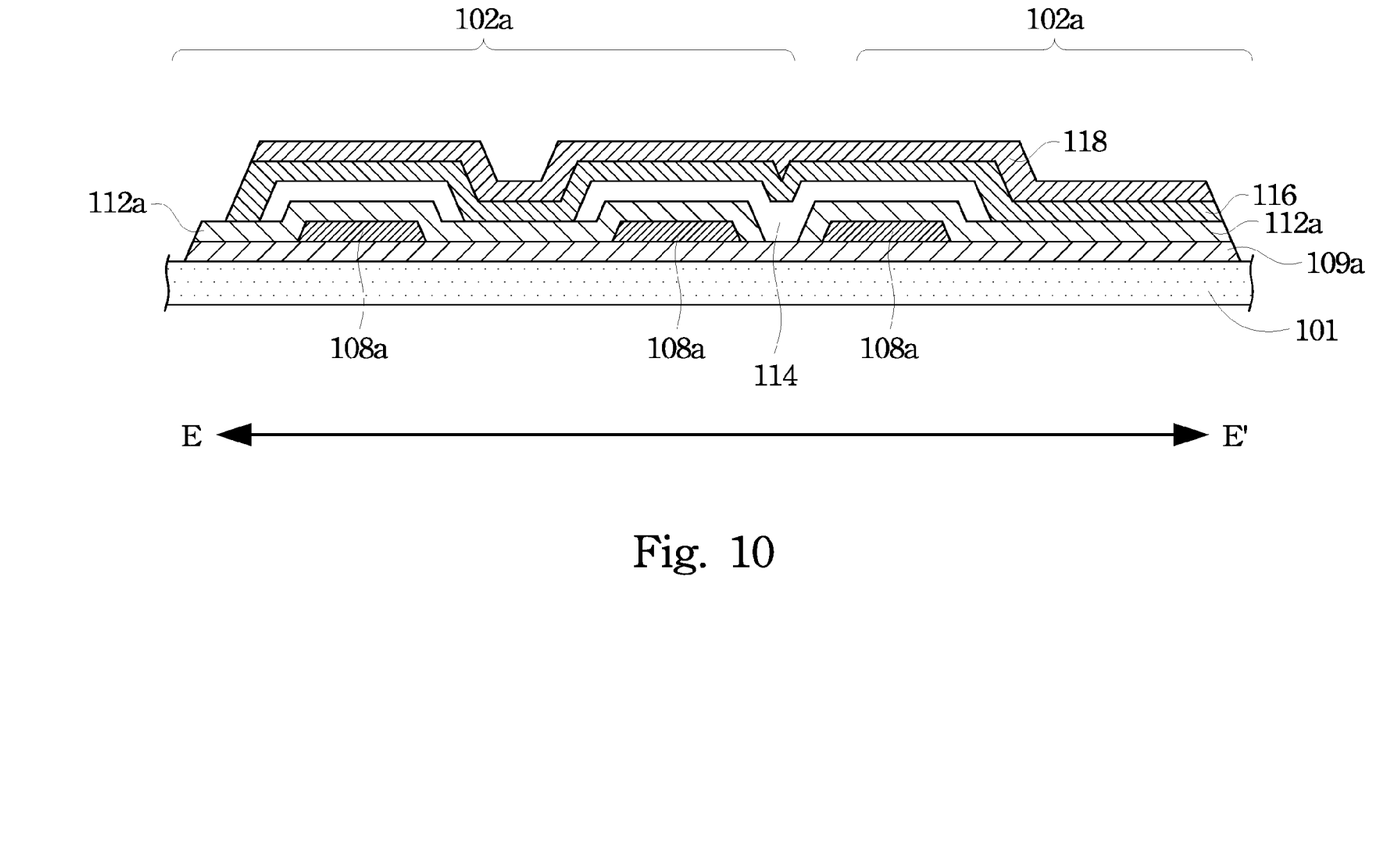
FIG. 10 illustrates a cross-sectional view taken along the cross-sectional line E-E' in FIG. 1A.
Figure 11:
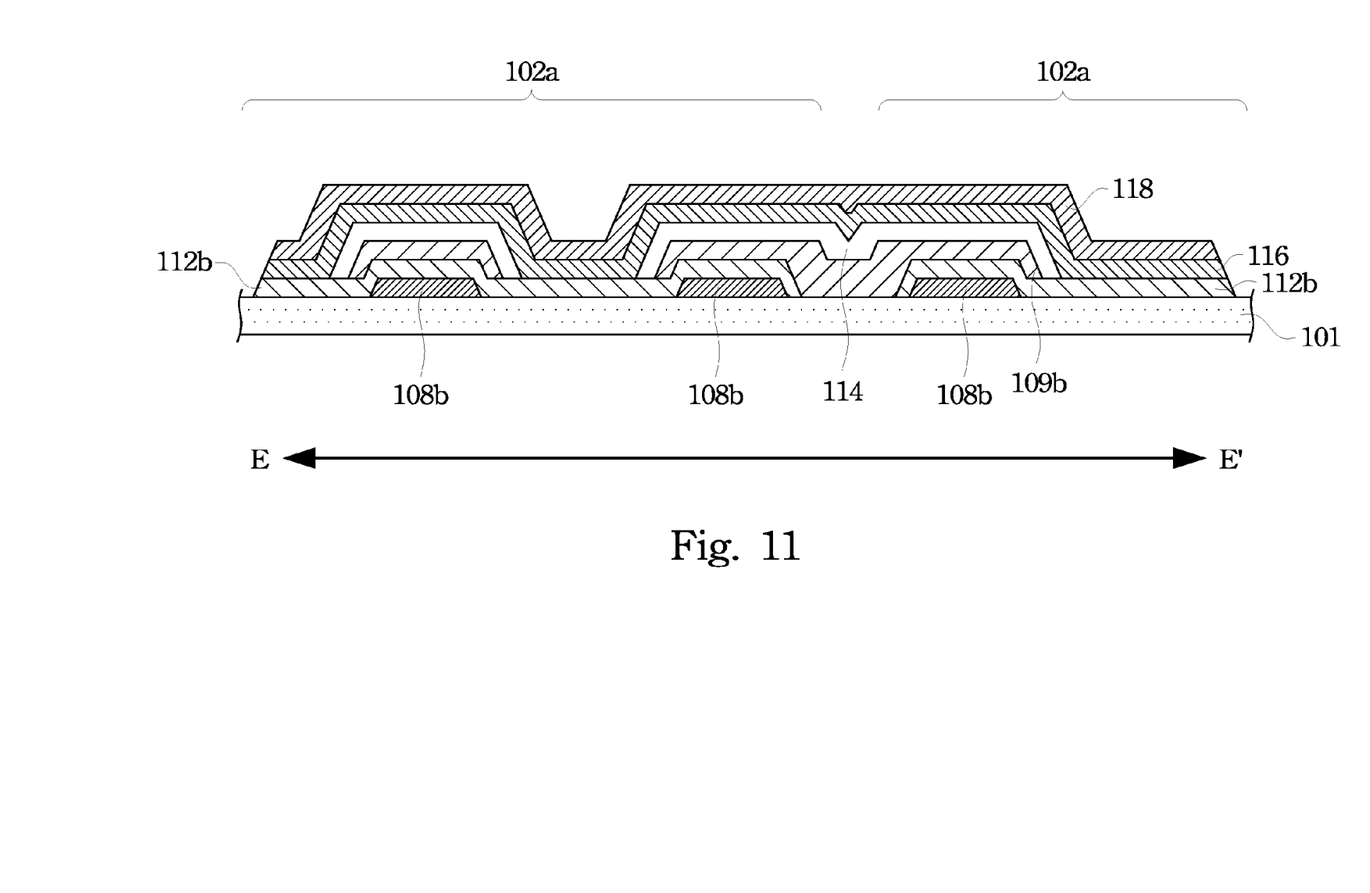
FIG. 11 illustrates a cross-sectional view taken along the cross-sectional line E-E' in FIG. 1B.

Referring to both FIGS. 10 and 11, wherein FIG. 10 illustrates a cross-sectional view taken along the cross-sectional line E-E' in FIG. 1A while illustrates a cross-sectional view taken along the cross-sectional line E-E' in FIG. 1B. These two cross-sectional views also cross two adjacent sub-emitting areas 102a. The major difference between the cross-sectional line E-E' and cross-sectional line D-D' lies in that the cross-sectional line E-E' does not cross any sections where the first metal lines (110a, 110b) are overlapped with the second metal lines (108a, 108b).

FIG. 10 only illustrates the second metal line 108a and does not illustrate the first metal line 110a. Besides, the second metal line 108a and the transparent anode layer 112a are disconnected by a border between two adjacent sub-emitting areas 102a, wherein the border is established by the insulating layer 114.

FIG. 11 only illustrates the second metal line 108b and does not illustrate the first metal line 110b. Besides, the second metal line 108b and the transparent anode layer 112b are disconnected by a border between two adjacent sub-emitting areas 102*a*, wherein the border is established by the insulating layer 109*b*.

In this embodiment, the first metal line 110 is only illustrated in vertical directions (as illustrated in FIG. 1), but the first metal line 110 can be formed in horizontal or vertical directions. Besides, the peripheral area 104 can be located at either one of the right, left, upper and lower edges of the transparent substrate 101.

According to the discussed embodiments, the OLED illumination device utilizes its design of "the first metal line overlapped with the second metal line" to effectively increase its emitting area or aperture ratio (compared with a conventional OLED illumination device). Besides, the design "a number of the first metal lines connected between the peripheral area (or a driver circuit) and a farther one of the sub-emitting areas is greater than a number of the first metal lines connected between the peripheral area (or a driver circuit) and a closer one of the sub-emitting areas" balances electrical currents or signals to each sub-emitting area, thereby achieving the uniform illumination for multiple sub-emitting areas.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An illumination device comprising:
a transparent substrate comprising an emitting area and a peripheral area, wherein the peripheral area is disposed at an edge of the transparent substrate, and the emitting area comprising a plurality of sub-emitting areas; and
a plurality of first metal lines disposed on the transparent substrate, each first metal line has an end connected to a corresponding one of the sub-emitting areas and an opposite end connected to the peripheral area,
wherein each sub-emitting area comprises an insulating layer, a second metal line and an OLED layer, and the second metal line is disposed between the transparent substrate and the OLED layer, the insulating layer is between the first metal lines and the second metal line, each first metal line is overlapped with the second metal line in vertical projection, and one of the first metal lines, which is connected to a first one of the sub-emitting areas, passes through a second one of the sub-emitting areas.

2. The illumination device of claim 1 further comprising a driver circuit disposed on the peripheral area.

3. The illumination device of claim 1 further comprising a driver circuit, which is electrically connected to the opposite end of each first metal line within the peripheral area.

4. The illumination device of claim 1, wherein a number of the first metal lines connected between the peripheral area and a farther one of the sub-emitting areas is greater than a number of the first metal lines connected between the peripheral area and a closer one of the sub-emitting areas.

5. The illumination device of claim 1, wherein the first metal lines and second metal line are opaque metal lines.

6. The illumination device of claim 1, wherein the first metal lines and second metal line share an equal width.

7. The illumination device of claim 1, wherein the first metal line and second metal line are different in respective widths by less than 20%.

8. The illumination device of claim 1, wherein the first metal lines are in parallel with one another.

9. The illumination device of claim 1, wherein the first metal lines are different in respective widths by less than 20%.

10. The illumination device of claim 1, wherein the second metal lines in respective sub-emitting areas are different in respective widths by less than 20%.

11. The illumination device of claim 1, wherein the insulating layer has a through hole, through which the second metal line is connected to a corresponding one of the first metal lines.

12. The illumination device of claim 1 further comprising a transparent anode layer, which is disposed above the second metal line and disposed between the OLED layer and the second metal line.

13. The illumination device of claim 12, wherein the insulating layer has a through hole, through which the first metal line is connected to the transparent anode layer.

14. The illumination device of claim 1, wherein the second metal line within the first one of the sub-emitting areas is insulated from the second metal line within a second one of the sub-emitting areas.

15. The illumination device of claim 1, wherein the sub-emitting areas generally have the same shape and area.

16. The illumination device of claim 1, wherein the second metal line is formed as grids or meshes within each sub-emitting area.

17. The illumination device of claim 1, further comprising an opaque cathode layer, disposed above the OLED layer.

18. The illumination device of claim 1, wherein one of the first metal lines, which is connected to the first one of the sub-emitting areas, is overlapped with the second metal line, within the second one of the sub-emitting areas, in vertical projection.

\* \* \* \* \*